(12) United States Patent  
Erchak et al.

(10) Patent No.: US 7,598,531 B2  
(45) Date of Patent: Oct. 6, 2009

(54) ELECTRONIC DEVICE CONTACT STRUCTURES

(75) Inventors: Alexei A. Erchak, Cambridge, MA (US); Elefterios Lidorikis, Ioannina (GR); John W. Graff, Swampscott, MA (US); Milan Singh Minsky, Newton, MA (US); Scott W. Duncan, Andover, MA (US)

(73) Assignee: Luminus Devices, Inc., Billerica, MA (US)

( * ) Notice: Subject to any disclaimer, the term of this patent is extended or adjusted under 35 U.S.C. 154(b) by 446 days.

(21) Appl. No.: 11/357,743

(22) Filed: Feb. 17, 2006

(65) Prior Publication Data

US 2007/0114636 A1    May 24, 2007

Related U.S. Application Data

(60) Provisional application No. 60/738,189, filed on Nov. 18, 2005.

(51) Int. Cl.  
*H01L 29/205* (2006.01)

(52) U.S. Cl. .................. 257/91; 257/95; 257/98; 257/99; 257/E33.063; 257/E33.065

(58) Field of Classification Search ............... 257/91, 257/95, 98, 99, 744, 745, E33.062, E33.063, 257/E33.065, E33.067  
See application file for complete search history.

(56) References Cited

U.S. PATENT DOCUMENTS

| | | | |
|---|---|---|---|
| 3,293,513 A | 12/1966 | Biard et al. | |
| 3,922,706 A | 11/1975 | Kaiser | |
| 4,864,370 A | 9/1989 | Gaw et al. | |
| H000842 H | 11/1990 | Ochs | |
| 6,180,960 B1* | 1/2001 | Kusuda et al. | ........ 257/91 |
| 6,307,218 B1 | 10/2001 | Steigerwald et al. | |

(Continued)

OTHER PUBLICATIONS

Office Actions from U.S. Appl. No. 11/351,325.

*Primary Examiner*—Sue Purvis  
*Assistant Examiner*—Leslie Pilar Cruz  
(74) *Attorney, Agent, or Firm*—Wolf, Greenfield & Sacks, P.C.

(57) ABSTRACT

Electronic devices involving contact structures, and related components, systems and methods associated therewith are described. Contact structures (also referred to as electrical contact structures or electrodes) are features on a device that are electrically connected to a power source. The power source can provide current to the device via the contact structures. The contact structures can be designed to improve current distribution in electronic devices. For example, the contact resistance of the contacts may be modified to improve current distribution (e.g., by controlling the shape and/or structure and/or composition of the contacts). The contact structures may include an intervening layer (e.g., a non-ohmic layer) positioned between a surface of the device and a conductive portion extending from a conductive pad. The intervening layer and/or conductive portions may be designed to have certain shapes (e.g., non-linear shapes) that promote current flow from the conductive pad towards the ends of the contacts to increase current spreading. The intervening layer can also reduce light generation underneath the light absorbing contacts to allow a greater percentage of the generated light to emerge from the surface of the device. Advantageously, devices including contact structures of the invention can increase uniformity of light emission and/or otherwise improve performance. As such, these contact structures are particularly suitable for use in a variety of light-emitting devices, including LEDs.

22 Claims, 9 Drawing Sheets

U.S. PATENT DOCUMENTS

| | | |
|---|---|---|
| 6,486,500 B1 | 11/2002 | Chen |
| 6,614,056 B1 * | 9/2003 | Tarsa et al. .................... 257/91 |
| 6,831,302 B2 | 12/2004 | Erchak et al. |
| 6,946,683 B2 | 9/2005 | Sano et al. |
| 6,958,494 B2 | 10/2005 | Lin et al. |
| 7,105,861 B2 | 9/2006 | Erchak et al. |
| 2005/0051785 A1 * | 3/2005 | Erchak et al. ................. 257/98 |
| 2006/0192194 A1 | 8/2006 | Erchak et al. |

* cited by examiner

ELECTRONIC DEVICE CONTACT STRUCTURES

RELATED APPLICATIONS

This application claims priority under 35 U.S.C. §119(e) to U.S. Provisional Patent Application No. 60/738,189, filed Nov. 18, 2005, and entitled "Electronic Device Contact Structures", which is incorporated herein by reference.

FIELD OF INVENTION

The present invention relates to electronic devices, and related components, systems and methods, and, more specifically, to light-emitting devices (e.g., LEDs) involving contact structures.

BACKGROUND

A light-emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

LEDs also include contact structures (also referred to as electrical contact structures or electrodes), which are features on a device that are electrically connected to a power source. The power source can provide current to the device via the contact structures, e.g., the contact structures can deliver current along the lengths of structures to the surface of the device where energy can be converted into light.

In some devices, problems may arise when the contact structures do not spread current uniformly across the surface of the device. This can lead to undesirable effects such as non-uniform light emission across the device, decreased light output, overheating, and performance degradation.

Contact structures that would, for example, minimize these effects in LEDs would find application in a number of different fields.

SUMMARY OF THE INVENTION

Light-emitting devices, and related components, systems, and methods associated therewith are provided.

In one aspect, the invention provides a series of electronic devices. In one embodiment, an electronic device comprises a material body designed for use in an electronic device. The material body has a surface and a contact structure supported by at least a portion of the surface of the material body. The contact structure comprises a patterned conductive layer comprising at least one conductive portion having a first end and a second end. The conductive portion extends from a first conductive pad at the first end, and the first and second ends define a length of the conductive portion. The contact structure has a contact resistance that varies non-linearly along the length of the conductive portion.

In another embodiment, an electronic device comprises a material body designed for use in an electronic device. The material body has a surface and a contact structure supported by the surface of the material body. The contact structure comprises a patterned non-ohmic layer comprising non-ohmic portions, and a patterned conductive layer comprising conductive portions. At least one conductive portion is disposed at least in part on a non-ohmic portion. The conductive portion has a first end and a second end, the first and second ends defining a length of the conductive portion. At least one non-ohmic portion and/or conductive portion has a shape that varies non-linearly along the length of the conductive portion.

In another embodiment, an electronic device comprises a material body designed for use in an electronic device. The material body has a surface and a contact structure supported by the surface of the material body. The contact structure comprises a patterned non-ohmic layer comprising non-ohmic portions and a patterned conductive layer. The patterned conductive layer comprises a first conductive portion extending from a conductive pad and is disposed on a first region including more than one of the non-ohmic portions. The patterned conductive layer also comprises a second conductive portion extending from a conductive pad and is disposed on a second region including more than one of the non-ohmic portions.

In another embodiment, an electronic device comprises a material body designed for use in an electronic device. The material body has a surface and a contact structure supported by the surface of the material body. The contact structure comprises a patterned non-ohmic layer comprising non-ohmic portions and a patterned conductive layer comprising conductive portions. At least one conductive portion is disposed at least in part on a non-ohmic portion. The number of conductive portions is not equal to the number of non-ohmic portions.

In another embodiment, an electronic device comprises a material body designed for use in an electronic device. The material body has a surface and a contact structure supported by the surface of the material body. The contact structure comprises a patterned Schottky metal layer comprising Schottky metal portions, and a patterned conductive layer comprising conductive portions. At least one conductive portion is disposed at least in part on a Schottky metal portion.

Other advantages, novel features, and objects of the invention will become apparent from the following detailed description of the invention when considered in conjunction with the accompanying drawings, which are schematic and which are not intended to be drawn to scale. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DESCRIPTION

The present invention relates to electronic devices and related components, systems and methods, and, more specifically, to electronic devices involving contact structures. Contact structures (also referred to as electrical contact structures or electrodes) are features on a device that are electrically connected to a power source. The power source can provide current to the device via the contact structures. The contact structures can be designed to improve current distribution in electronic devices. For example, the contact resistance of the contact members may be modified to improve current distribution (e.g., by controlling the shape and/or structure and/or composition of the contact members). The contact structures may include an intervening layer (e.g., a non-ohmic layer) positioned between a surface of the device and a conductive portion extending from a conductive pad. As described further below, the intervening layer and/or conductive portions may be designed to have certain shapes (e.g., non-linear shapes) that promote current flow from the conductive pad towards the ends of the contact members to increase current spreading. The intervening layer can also reduce light generation underneath the light absorbing contact members to allow a greater percentage of the generated light to emerge from the surface of the device. Advantageously, devices including contact structures of the invention can increase uniformity of light emission and/or otherwise improve performance. As such, these contact structures are particularly suitable for use in a variety of light-emitting devices, including LEDs.

Although the primary description below involves contact structures in relation to LEDs, it is to be understood that contact structures of the invention can be used, e.g., to spread current and/or to improve performance, in other electronic devices.

Figure 1A:
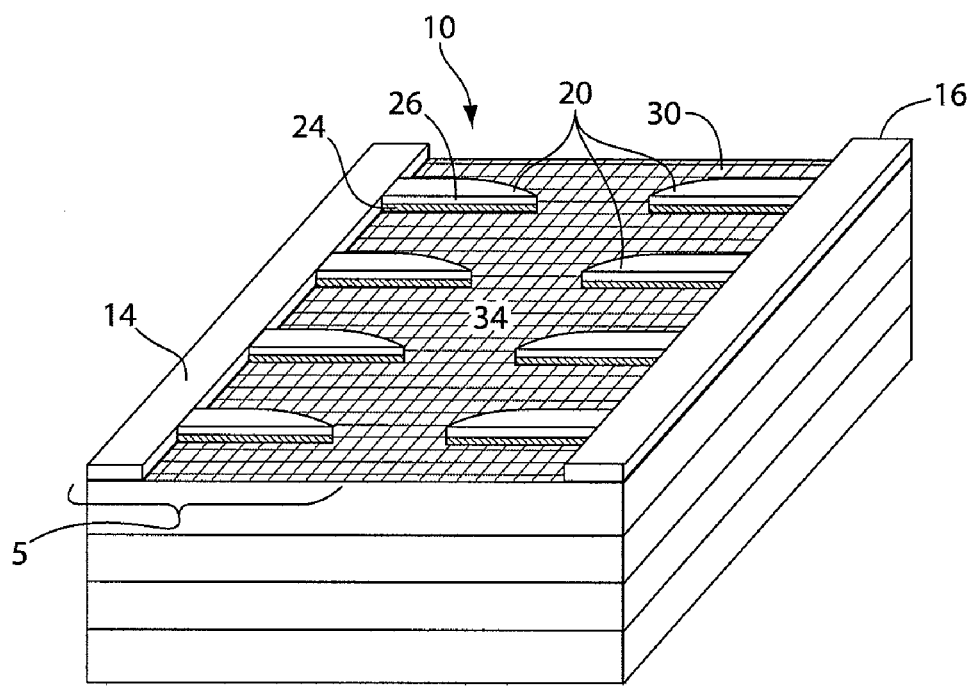
FIGS. 1A and 1B show a device including a contact structure according to one embodiment of the invention.
Figure 1B:
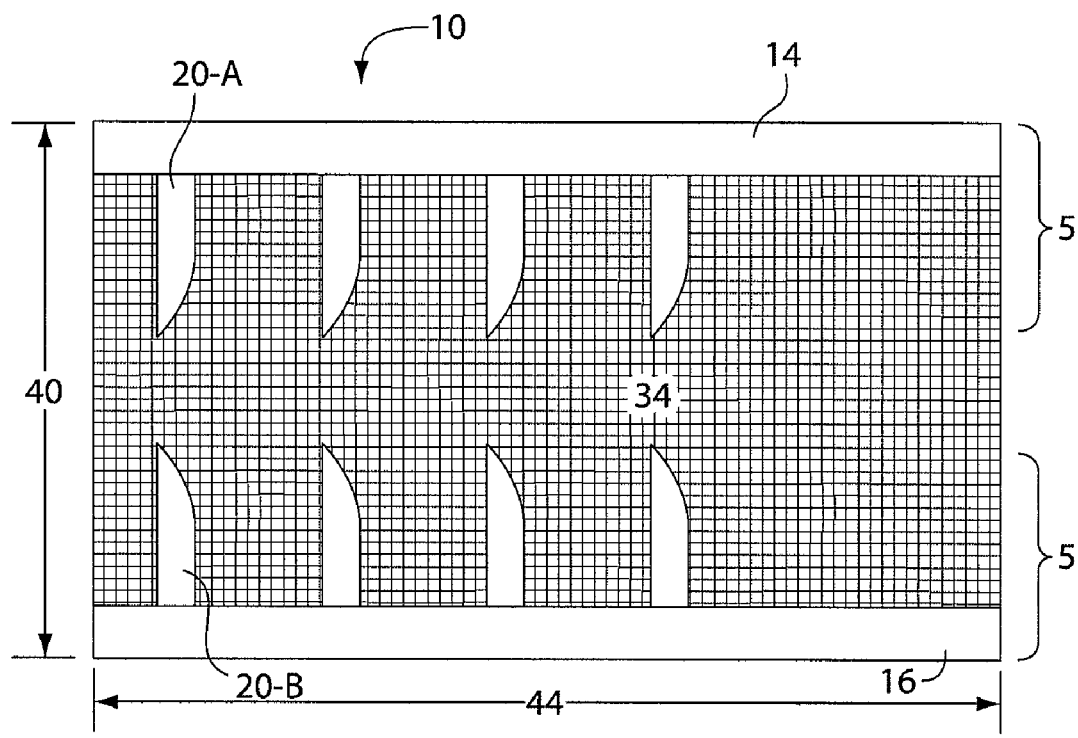

FIGS. 1A and 1B show contact structures 5 of LED 10 according to one embodiment of the invention. In this particular embodiment, the contact structures include two conductive pads 14 and 16 and contact members 20 extending from the conductive pads. The conductive pads and contact members are disposed on a top surface 30 of the LED. The contact member may further be in contact with non-ohmic portion 24 positioned between a conductive portion 26 and the top surface of the LED. Conductive portions of the contact members can form ohmic contacts with the top surface of the LED. Wire bonds (not shown) connected to the conductive pads can provide current and voltage to the LED. The contact members can spread the current from the conductive pads to the top surface of the LED, e.g., away from the conductive pads and/or towards central region 34. In some embodiments, the non-ohmic portion and/or the conductive portion of a contact member may have a shape (e.g., a non-linear shape) that can promote current spreading, amongst other advantages, as described in more detail below.

Figure 2:
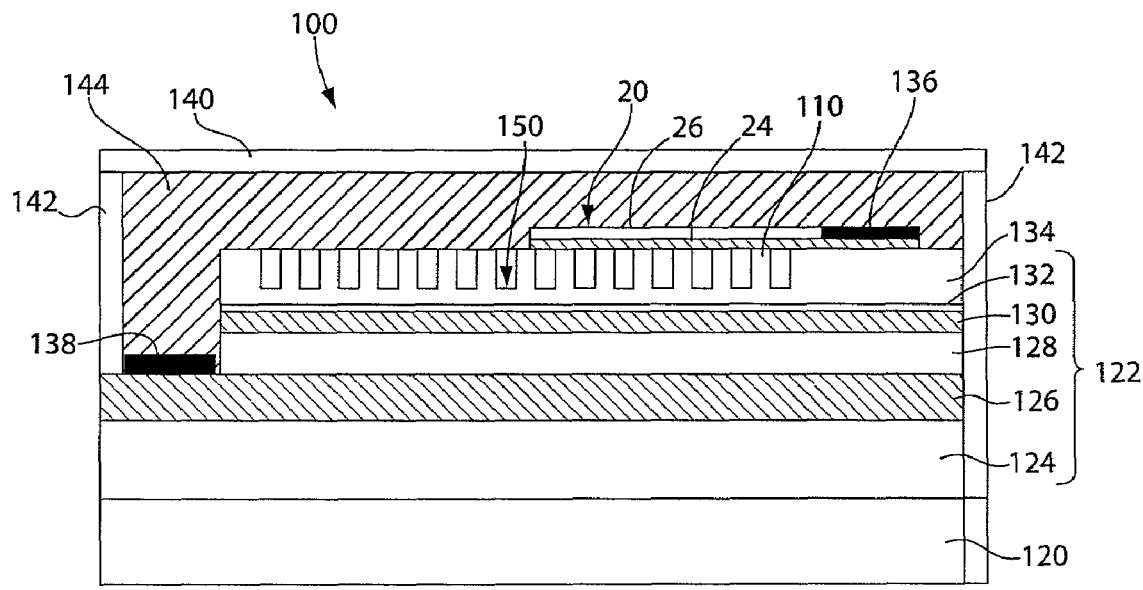
FIG. 2 shows a side view of an LED according to another embodiment of the invention.

FIG. 2 shows a side view of LED 100 including contact members 20 in the form of a packaged die. LED 100 includes a material body, which includes multi-layer stack 122 disposed on a submount 120. Multi-layer stack may include a silicon doped (n-doped) GaN layer 134, which may have a thickness of, e.g., 320 nm. The silicon doped layer can have a pattern of openings 150 in its upper surface 110. The openings can lead to a surface that has a dielectric function that varies spatially according to a pattern, as described further below. The multi-layer stack can also include bonding layer 124, reflective layer 126 (e.g., 100 nm thick comprising silver or an alloy thereof), magnesium doped (p-doped) GaN layer 128 (e.g., 40 nm thick), light-generating region 130 (e.g., 120 nm thick), which can be formed of multiple InGaN/GaN quantum wells, and AlGaN layer 132. An n-side conductive pad 136 can be positioned on the silicon doped GaN layer, and a p-side conductive pad 138 can be positioned on the reflective layer. Contact members 20 extend from conductive pad 136. In some embodiments, encapsulant material 144 (e.g., epoxy having an index of refraction of 1.5) can optionally be present between the silicon doped GaN layer, cover slip 140, and supports 142, although such a material is not required. The encapsulant material may extend into the openings of the upper surface; however, in some embodiments, the encapsulant material does not extend into the openings. It should be understood that various other modifications can be made to the representative LED structures presented, and that the invention is not limited in this respect. For example, the n-doped and p-doped sides may be interchanged so as to form an LED having a p-doped region in contact with the conductive pad 136 and an n-doped region in contact with the conductive pad 138.

Light can be generated by LED 100 as follows. P-side conductive pad 138 may be held at a positive potential relative to n-side conductive pad 136, which causes electrical current to be injected into the LED. As the electrical current passes through light-generating region 130, electrons from n-doped layer 134 can combine with holes from p-doped layer 128 in the light-generating region, which can cause formation of light. The light-generating region may contain a plurality of point dipole radiation sources that emit light (e.g., isotropically) within the region with a spectrum of wavelengths characteristic of the material from which the light-generating region is formed. For a light-generating region including InGaN/GaN quantum wells, the spectrum of wavelengths of light generated by the region can have a peak wavelength of about 460 nanometers (nm) and a full width at half maximum (FWHM) between 20 and 50 nm. In one embodiment, the spectrum of wavelengths generated has a FWHM of about 30 nm.

It is to be noted that the charge carriers in the p-doped layer 128 have relatively low mobility compared to the charge carriers in the n-doped semiconductor layer. As a result, placing the reflective layer, or any conductive layer such as a contact layer, along the surface of the p-doped layer can enhance the uniformity of charge injection from the p-side conductive pad into the p-doped layer and light-generating region. This can also reduce the electrical resistance of the device and/or increase the injection efficiency of the device. Because of the design of contact members 20 (discussed in more detail below), electrons can spread relatively quickly from the n-side conductive pad throughout the AlGaN and silicon doped GaN layers, e.g., so that the current density within the light-generating region is substantially uniform across the light-generating region. It is also to be noted that the reflective layer has relatively high thermal conductivity, allowing it to act as a heat sink for the LED (e.g., to transfer heat vertically from the multi-layer stack to the submount).

At least some of the light that is generated by the light-generating region may be directed toward the reflective layer. This light can be reflected by the reflective layer and can emerge from the LED via upper surface 110. Additionally and/or alternatively, light can be reflected by the reflective layer and then absorbed within the semiconductor material in the LED to produce an electron-hole pair that can combine in the light-generating region, causing the region to generate light. Similarly, at least some of the light that is generated by the light-generating region can be directed toward the n-side conductive pad. The underside of the n-side conductive pad can be formed of a material (e.g., a Ti/Al/Ni/Au alloy) that can reflect at least some of the light generated by the light-generating region. Accordingly, the light that is directed to the n-side conductive pad can be reflected by the pad and subsequently emerge from the LED via the upper surface (e.g., by being reflected from the reflective layer). Additionally and/or alternatively, the light that is directed to the n-side conductive pad can be reflected by the pad and may be absorbed within the semiconductor material in the LED to produce an electron-hole pair that can combine in the light-generating region, causing the region to generate light (e.g., with or without being reflected by the reflective layer).

In some embodiments, emitting surface 110 of the LED has a dielectric function that varies spatially which can improve the extraction efficiency of light generated by the LED and may enable the high power levels described further below. For example, the dielectric function can vary spatially according to a pattern. The pattern may be periodic (e.g., having a simple repeat cell, or having a complex repeat super-cell), periodic with de-tuning, or non-periodic. Examples of non-periodic patterns include quasi-crystal patterns, for example, quasi-crystal patterns having 8-fold symmetry. In certain embodiments, the emitting surface is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is herein incorporated by reference in its entirety.

While certain semiconductor materials have been described in connection with the LED of FIG. 2, other semiconductor materials can also be used. In general, any semiconductor material suitable for use, e.g., in a light-emitting device, can be used. Non-limiting examples of semiconductor materials include materials from Groups 13-16 of the Periodic Table of Elements, organic semiconductor materials, and silicon. Examples of other light-generating materials include InGaAsP, AlInGaN, AlGaAs, and InGaAlP. Organic light-emitting materials include small molecules such as aluminum tris-8-hydroxyquinoline ($Alq_3$) and conjugated polymers such as poly[2-methoxy-5-(2-ethylhexyloxy)-1,4-vinylenephenylene] or MEH-PPV.

Materials used to form conductive and insulating portions can also vary, as described in more detail below.

In general, an LED can have any desired shape. Examples of such shapes include square, circular, rectangular, triangular, trapezoidal, and hexagonal. The dimensions of an LED can also vary.

In some embodiments, an LED may have a width and/or length ranging from about 0.5 mm to about 1 cm. The aspect ratio (i.e., the ratio of a length to width of a structure) of an LED, or components of the LED, can also vary. For instance, an LED may have an aspect ratio of about 0.5 to 1, 1 to 2, or 2 to 3. In some embodiments, the aspect ratio of an LED may vary according to the dimensions of a display unit, e.g., the dimensions of the surface of the LED that emits light may be substantially similar to the dimensions of the surface of a display unit that is illuminated by the light emitted by LED. The aspect ratio of the display unit can be, for example, 1920×1080, 640×480, 800×600, 1024×700, 1024×768, 1024×720, 1280×720, 1280×768, 1280×960, or 1280×1064.

Referring back to FIG. 1B, FIG. 1B shows a top view of LED 10 having width 40 and length 44, and including conductive pads 14 and 16, and contact members 20. In some embodiments, the width of a conductive pad can be larger than a width of a contact member. The larger width of the conductive pads can allow the pads to function as power busses and spread a relatively large amount of power down the bus to the contact members. The widths of the conductive pads and contact members can be made relative to the size of the LED and/or can be based on other factors such as lithography and processing parameters. In some cases, the widths of the contact members can vary (e.g., non-linearly) as a function of length of the contact member, as discussed in more detail below.

Conductive pads can have any suitable dimension and/or shape. For instance, the length of a conductive pad can range from 50 μm to 500 μm (e.g., between 50 μm and 200 μm, between 200 μm and 350 μm, or between 350 μm and 500 μm). The width of a conductive pad can range, for example, from 1 μm to 50 μm (e.g., between 1 μm and 20 μm, between 20 μm and 30 μm, or between 30 μm and 50 μm). The height of the conductive pads can vary based on, for example, current and power to be supplied to the LED, or based on deposition and processing parameters. For example, the conductive pads can have a height ranging from 0.1 μm to 100 μm (e.g., between 0.1 μm and 1 μm, between 1 μm and 10 μm, or between 10 μm and 100 μm). For devices having two or more conductive pads, e.g., as shown in FIG. 1, the conductive pads may have substantially similar dimensions. In other cases, one conductive pad may have dimensions that are substantially different from another conductive pad of the same device.

Conductive pads can be positioned in any suitable arrangement on a surface (e.g., a top surface) of an LED. In some cases, the positioning of a conductive pad may depend on the shape of the LED. In one embodiment, conductive pads are positioned proximate one or more edges of the device. In another embodiment, a conductive pad can be positioned near the center of the device. In yet another embodiment, conductive pads can be positioned parallel to one another, and/or substantially opposite one another, on a surface of the LED.

An LED can also have any suitable number of conductive pads (e.g., 1, 2, or more conductive pads).

Conductive pads can be made of any suitable material. In some embodiments, a metal is used to form a conductive pad. Non-limiting examples of metals include gold, silver, platinum, copper, aluminum, nickel, titanium, tungsten, combinations thereof. Other metals or metal alloys, including transition elements from Groups 3-12 of the Periodic Table of Elements, can also be used. In some particular embodiments, a conductive pad may include a semi-conductive material.

Figure 3:
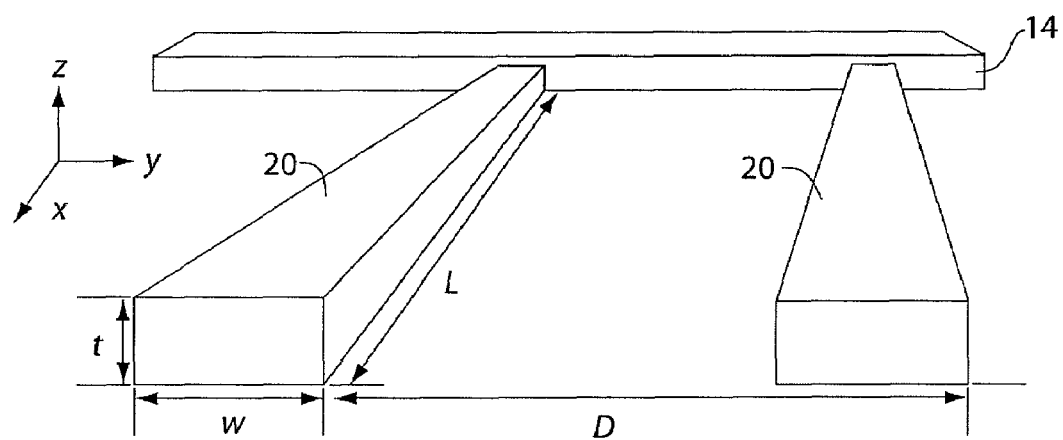
FIG. 3 shows a side perspective view of a contact structure according to another embodiment of the invention.

In general, contact members can be designed to have a desired shape and dimension. Contact members include conductive portions and may also include a non-ohmic portion. As shown in FIG. 3, a device may include contact members 20 that extend from conductive pad 14. The contact members may include a length, L, a width, w, and a height, t. As illustrated in FIG. 3, contact members 20 may have substantially similar dimensions. In other embodiments, however, contact members of a device may have substantially different dimensions relative to one another. The spacing between adjacent contact members, or the periodicity of the contact members, D, may be the same amongst a contact structure of a device. However, the periodicity may vary across a contact structure in some designs.

Figure 4:
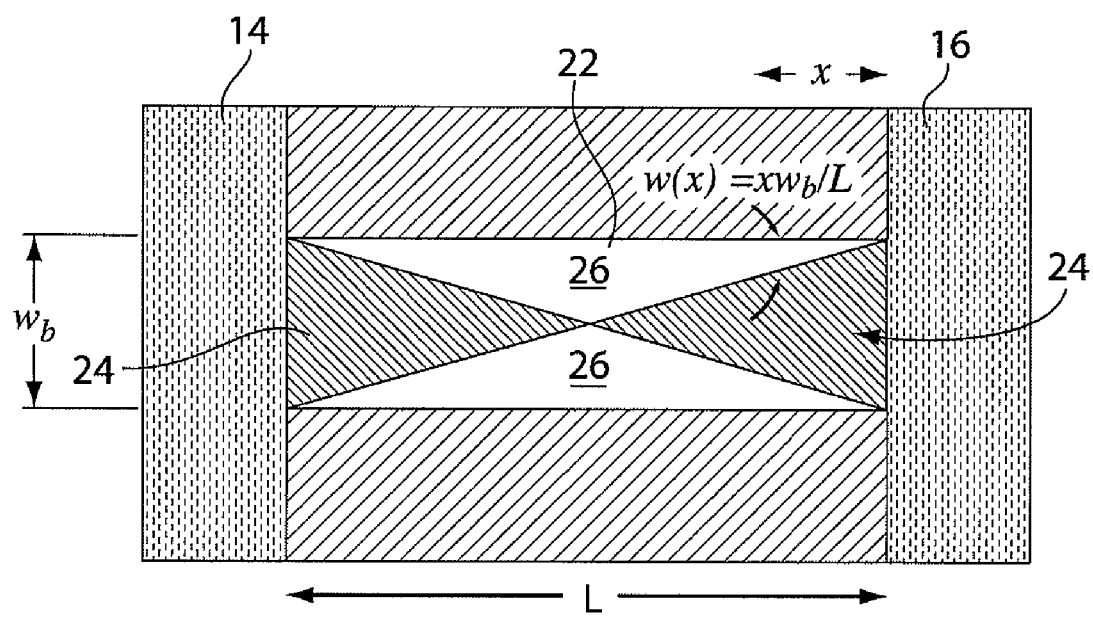
FIG. 4 shows a top view of a contact structure according to another embodiment of the invention.

Another example of varying dimensions of contact members is illustrated in FIG. 1B. FIG. 1B shows contact members that have varying widths along the length of the contact member extending from a conductive pad, e.g., toward central region 34 of the LED. Contact members can be positioned substantially opposite one another on a device, e.g., contact member 20-A may be positioned opposite contact member 20-B, and the two structures may not be in physical contact with one another. In other cases, contact members 20-A and 20-B can form one continuous contact member extending from conductive pads 14 and 16, as shown in FIG. 4. In the embodiment illustrated in FIG. 4, contact member 22 extends from conductive pad 14 to conductive pad 16. The contact member may include conductive portion 26 disposed on non-ohmic portion 24. For instance, the non-ohmic layer can be patterned such that the conductive portion extends past one or more edges of the non-ohmic portions to form an electrical contact to the material body. As illustrated in FIG. 4 and in other embodiments described herein, a contact member may include one or more non-ohmic portions having different dimensions than the dimensions of the conductive portion. In one embodiment, one of the non-ohmic portion or conductive portion can be tapered and/or have a non-linear shape. In other embodiments, both the non-ohmic portion and the conductive portion can be tapered and/or have a non-linear shape, as described in more detail below.

In some embodiments, contact structures of the invention may include a conductive portion, and the structure can have a contact resistance that varies non-linearly along a length of the conductive portion. For instance, the contact resistance may vary from a first end to a second end of the conductive portion, the first and/or second ends being in connection (e.g., electrical contact) with one or more conductive pads. The non-linear variation in contact resistance may be caused by one or more factors such as the shape of the conductive portion and/or non-ohmic portion, the material composition of the conductive portion and/or the non-ohmic portion, and/or the positioning of the conductive portion relative to the non-ohmic portion.

It should be understood that in some embodiments, contact members (including conductive portions and/or non-ohmic portions) having a non-linear contact resistance may have a shape defined by a linear taper. For example, the contact member may be substantially triangular in shape. In other embodiments, contact members may be non-tapered, e.g., they may be substantially rectangular in shape.

Advantageously, the non-linear variation in contact resistance of a contact structure can promote current flow (e.g., towards the ends of the contact members) to increase current spreading across a top surface of a device. This can cause reduction in current crowding, greater uniformity of light emission, and/or can improve performance in a device.

In one embodiment, a contact structure includes a conductive portion and/or an insulating portion having a non-linear shape. The non-linear shape of the conductive and/or insulating portion can cause the contact structure to have a non-linear contact resistance along a length of the conductive portion. For instance, in the embodiment illustrated in FIGS. 5A and 5B, contact member 20 includes conductive portion 22 disposed on non-ohmic portion 24. The conductive portion may be rectangular and the non-ohmic portion may have a non-linear shape. For example, surface 50 of the non-ohmic portion may be non-linear along length, L, of the conductive portion, e.g., from first end 56 to second end 58 of the conductive portion. The non-linear shape can cause the contact resistance to vary non-linearly along the length of the contact member. In some instances, more than one surface or region of a non-ohmic and/or conductive portion may be non-linear such that the contact resistance varies non-linearly along the length of the contact member. (For some embodiments that include a conductive portion extending the entire length of the contact member, the first and second ends of the conductive portions may be the same as the first and second ends of the contact member, and the length of the conductive portion may be the same as the length of the contact member. Thus, for some embodiments, the terms first end, second end, and length, may be used interchangeably herein between conductive portions and contact members.)

The non-linear shape of a conductive portion and/or non-ohmic portion may vary, for instance, depending on the dimensions of the contact member, the number of conductive portions relative to non-ohmic portions, the spacing between conductive and non-ohmic portions, whether the contact member is connected to one, or more, conductive pads, and the type of materials used to form the conductive and/or non-ohmic portions. As such, a variety of shapes may be suitable for efficiently distributing current in a contact structure of the invention.

In some cases, a non-linear shape of a conductive portion and/or non-ohmic portion may include a shape that can be defined by a quadratic equation. For instance, the shape of surface 50 of non-ohmic portion in FIG. 5A can be defined by a quadratic equation (e.g., if the quadratic equation is plotted on a graph to give the resulting shape). The shape of surface 50, and thus the quadratic equation that defines the shape of the surface, may be designed to allow efficient current distribution from end 56 to end 58 of the contact member, e.g., towards a central region of the device, as described in further detail in Example 1.

Figure 6A:
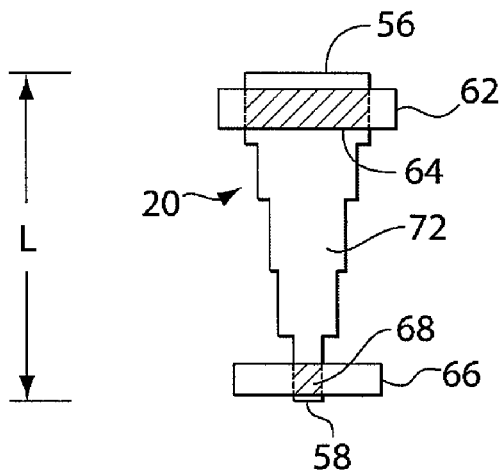
FIGS. 6A-6D show various non-linear shapes of contact members according to another embodiment of the invention.
Figure 6B:
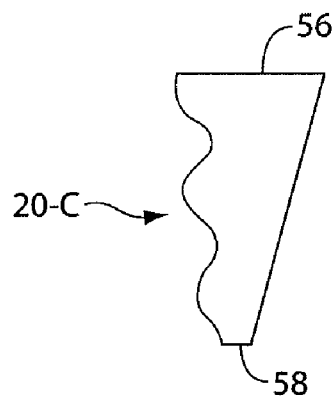
Figure 6C:
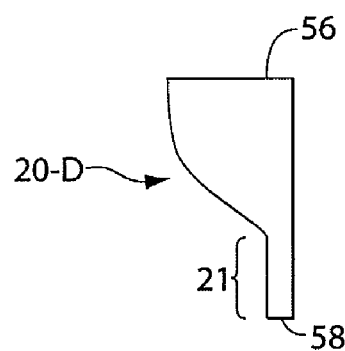
Figure 6D:
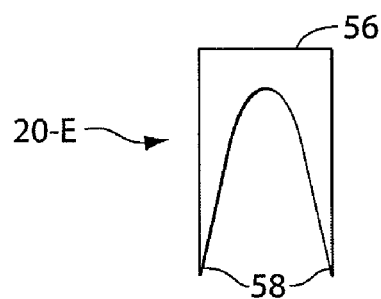

Shapes of a surface of a conductive and/or non-ohmic portion of a contact member can also be defined by other types of polynomial functions including cubic (i.e., a polynomial function of degree 3), quartic (i.e., a polynomial function of degree 4), and quintic functions (i.e., a polynomial function of degree 5). Graphs of these functions can give continuous non-linear curves that may define the shape of a surface of a conductive and/or non-ohmic portion of a contact structure. As shown in FIG. 6, the shape of a contact member (or the shape of conductive and/or non-ohmic portions of the contact member) can also be defined by other continuous non-linear functions such as step functions (FIG. 6A) and trigonometric functions (FIG. 6B). It should be understood that in some embodiments, a contact member having a non-linear contact resistance along the length of the contact member may include a linear portion (e.g., portion 21 of FIG. 6C) in addition to the non-linear portion. The length of the non-linear portion may be, for example, at least 50%, at least 70%, or at least 90% of the length of the contact member.

Figure 5A:
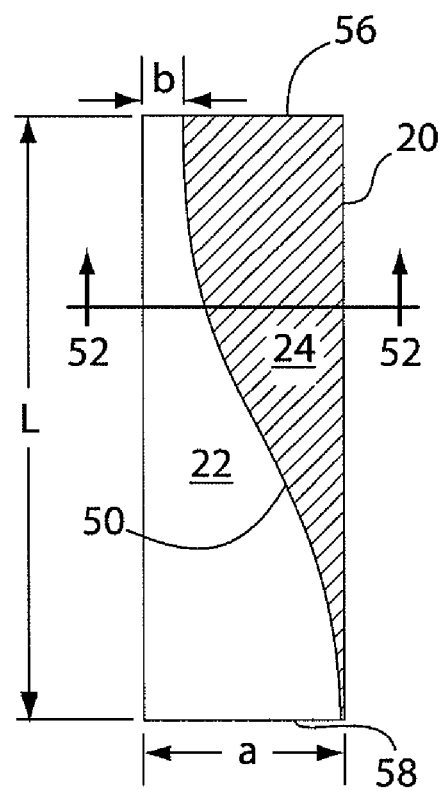
FIGS. 5A and 5B show a contact member with a non-linear variation of contact resistance along the length of the contact member according to another embodiment of the invention.
Figure 5B:
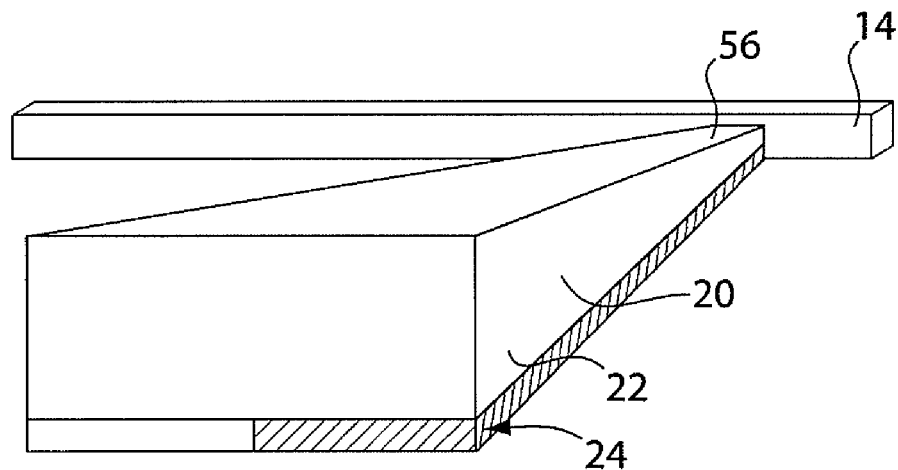

In another embodiment, the shape of a contact member (or the shape of conductive and/or non-ohmic portions of the contact member) can be defined by the size of certain areas and/or widths within the contact member, e.g., as a function of a length of the contact member. For instance, as illustrated in FIG. 6A, contact member 20 may include first region 62 proximate first end 56, and second region 66 proximate second end 58. The first end may be connected to a conductive pad such that current can be distributed from the first end to the second end of the contact member along length L, e.g., via the ohmic contact. The shape of the contact member can be defined by non-linear surface 72, which can taper from the first end to the second end. The shape of the non-linear surface can be designed such that area 64 (or the width of area 64) within the first region is larger than area 68 (or the width of area 68) within the second region, e.g., areas and/or widths of the contact member (or conductive and/or non-ohmic portions of the contact member) may decrease as a function of distance from a conductive pad along a length of the contact member. Similarly, as shown in FIG. 5A, the area and/or width of non-ohmic portion 24 decreases from one end to the other end of the contact member. Such shapes and designs can allow contact structures of the invention to have non-linear contact resistances along the lengths of the contact members.

Conductive and/or non-ohmic portions of a contact member may be shaped like a finger in certain embodiments of the invention. For instance, a length of the contact member may be greater than a width of the contact member. In some cases, a length of the contact member may be greater than 5 times, greater than 20 times, or greater than 50 times a width of the contact member.

It should be understood that contact members may have other shapes.

In some instances, a conductive and/or non-ohmic portion can be shaped (e.g., non-linearly) such that the contact resistance is maximum near an end connected to a conductive pad, and minimum near a second end that is not connected to a conductive pad (e.g., near a central region of the device). Sometimes, non-linear shapes of both the conductive and non-ohmic portions contribute to promoting the current flow towards a central region of the device. In other instances, such as when the two ends of a contact member are connected to respective conductive pads, the non-linear shapes of the conductive and/or non-ohmic portions can create maximum contact resistances near the two ends, and a minimum contact resistance near the center of the contact member. Accordingly, current can be efficiently distributed near the center of the contact member and, therefore, towards a central region of the device.

In some embodiments, the non-linearity of the contact resistance of a contact member can be described in terms of the ratio of widths a/b (i.e., a tapering ratio) between the maximum and minimum conductive portions throughout the length. The tapering ratio can vary linearly or non-linearly, e.g., as shown in FIG. 5A. For instance, the conductive portion can vary non-linearly between the values of a and b from a first end to a second end of the contact member. Additionally, another embodiment may include any type of non-linear variation, which may be non-continuous or stepwise. In some cases, the tapering ratio as a function of contact member length may be defined by a continuous non-linear function, such as a quadratic function. In other embodiments, the tapering ratio as a function of contact length may be defined by a non-continuous non-linear function, such as a discontinuous stepwise function.

Figure 7:
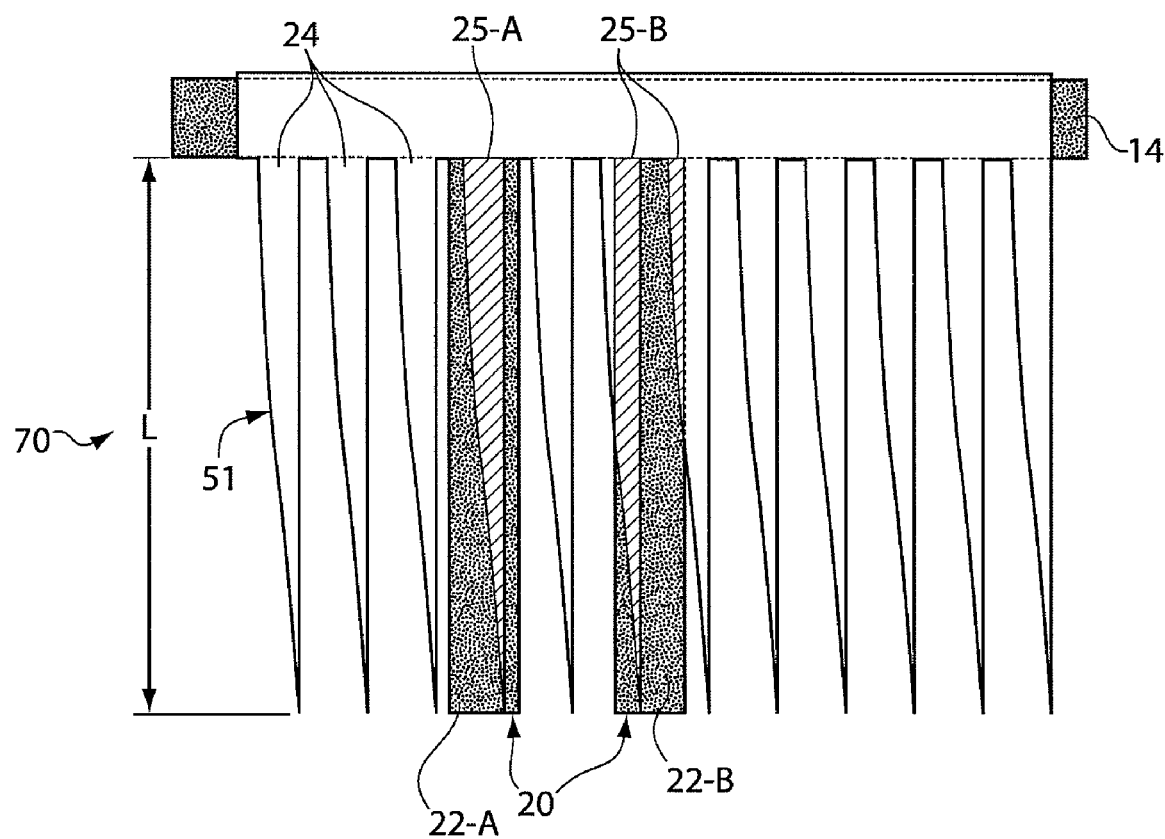
FIG. 7 shows a contact structure including one arrangement of conductive and non-ohmic portions according to another embodiment of the invention.

In some embodiments of the invention, a conductive portion is disposed on more than one non-ohmic portions of a contact member. The non-ohmic portions may be continuous, or discontinuous, along a length of the contact member. FIG. 7 shows contact structure 70 including contact members 20 with non-ohmic portions 24 that are continuous along length L of the contact members. The contact members include conductive portions 22 disposed on more than one non-ohmic portions, with contact areas 25 being areas of overlap between the conductive and non-ohmic portions.

In certain embodiments, the contact structure may include a non-ohmic layer with non-ohmic portions having particular dimensions in an arrangement such that conductive portions can be disposed on the non-ohmic layer without significant alignment. For instance, in FIG. 7, conductive portion 22-A is disposed on one non-ohmic portion, resulting in contact area 25A. Conductive portion 22-B is disposed on more than one non-ohmic portions, creating contact area 25-B. Because of the dimensions and arrangement of the non-ohmic portions, as well as the relative dimensions of the conductive portions, contact area 22-A can be substantially equal to contact area 22-B. Consequently, the conductive portions may not require precise alignment when disposed on the non-ohmic portions. In other words, alignment of a single conductive portion on a single non-ohmic portion may not be necessary like in some convention devices.

The contact members of FIG. 7 can have a non-linear contact resistance as a function of the length of the contact member. In one embodiment, the non-linear tapering of the ohmic portions can cause a maximum contact resistance near the end of the contact member closest to the conductive pad, and a minimum contact resistance near the end of the contact member farther from the conductive pad. In another embodiment, the effective contact area can be such that the contact resistance along the contact member varies by $1/distance^2$. Of course, the effective contact area and/or contact resistance can vary by other ratios along the length of the contact member.

Although FIG. 7 shows only two conductive portions disposed on the non-ohmic layer, additional conductive portions can be disposed on the layer. At least two of these conductive portions may be disposed on more than one non-ohmic portions, and the area of contact between the conductive and non-ohmic portions may be substantially equal for each of the conductive portions. In some cases, a majority of the contact members include contact areas that are substantially equal to one another. For example, greater than 50%, greater than 70%, greater than 90%, greater than 95%, or 100% of the contact members may include contact areas that are substantially equal to one another.

The disposed conductive portions may have a constant periodicity (e.g., the spacing between each of the conductive portions may be substantially equal). Sometimes, however, the conductive portions may be unequally spaced relative to one another. Despite unequal spacing of conductive portions, the areas of contact between the conductive and non-ohmic portions may be substantially equal for each, or a majority, of the conductive portions.

The number of contact members in contact structures of the invention can vary, e.g., depending on the dimensions of the device, the dimensions and/or arrangement of the contact members, and/or the amount of power supplied to the device. The number of non-ohmic portions relative to conductive portions can also vary, e.g., depending on the arrangement of non-ohmic and conductive portions on the device. Sometimes, the number of non-ohmic and conductive portions are equal, for instance, when conductive portions are aligned directly on top of the non-ohmic portions. In some cases, the number of non-ohmic and conductive portions are not equal. For instance, a contact structure may include a greater number of non-ohmic portions than conductive portions. This latter arrangement may be suitable for structures such as ones shown in FIG. 7, e.g., where precise alignment of conductive and non-ohmic portions is not required.

In some cases, a contact structure may include n numbers of conductive portions, and (n+x) non-ohmic portions, where x is an integer equal to or greater than 1. In other cases, a contact structure can include a multiple of non-ohmic portions, e.g., 1.5n, 2n, 3n, or 5n non-ohmic portions.

In some embodiments, uniform distribution with a contact resistance tapering can be calculated using:

$$\rho_c(x) = \rho_c^0[1 + \sigma(1 - x/L)^2]$$

where $\sigma$ is related to the tapering ratio a/b, e.g., $$\sigma + 1 = \frac{a}{b},$$

and L is the length of the contact member. As described in more details in the Examples, $\sigma$ can be plotted as a function of L. The width of the non-ohmic portion may scale as $$w_{ox}(x) = w_0\left[1 - \frac{1}{1 + \sigma(1 - x/L)^2}\right]$$

where $w_o$ is the width of the contact member, $w_{ox}$ is the width of the non-ohmic portion, x is the distance from the end of the contact member, $\sigma$ is related to the tapering ratio $$\left(\text{e.g.,}\ \sigma + 1 = \frac{a}{b}\right),$$

and L is the length of the contact member.

Those of ordinary skill in the art can design dimensions and arrangements of non-ohmic and/or conductive portions based upon knowledge in the art and by using routine experimentation (e.g., simulations), in combination with the description herein, in order to achieve the results described. Suitable criteria for designing certain contact structures have been described in U.S. Patent Publication No. 2005/0051785, which is incorporated herein by reference, and is based on U.S. patent application Ser. No. 10/871,877, filed on Jun. 18, 2004.

Figure 8A:
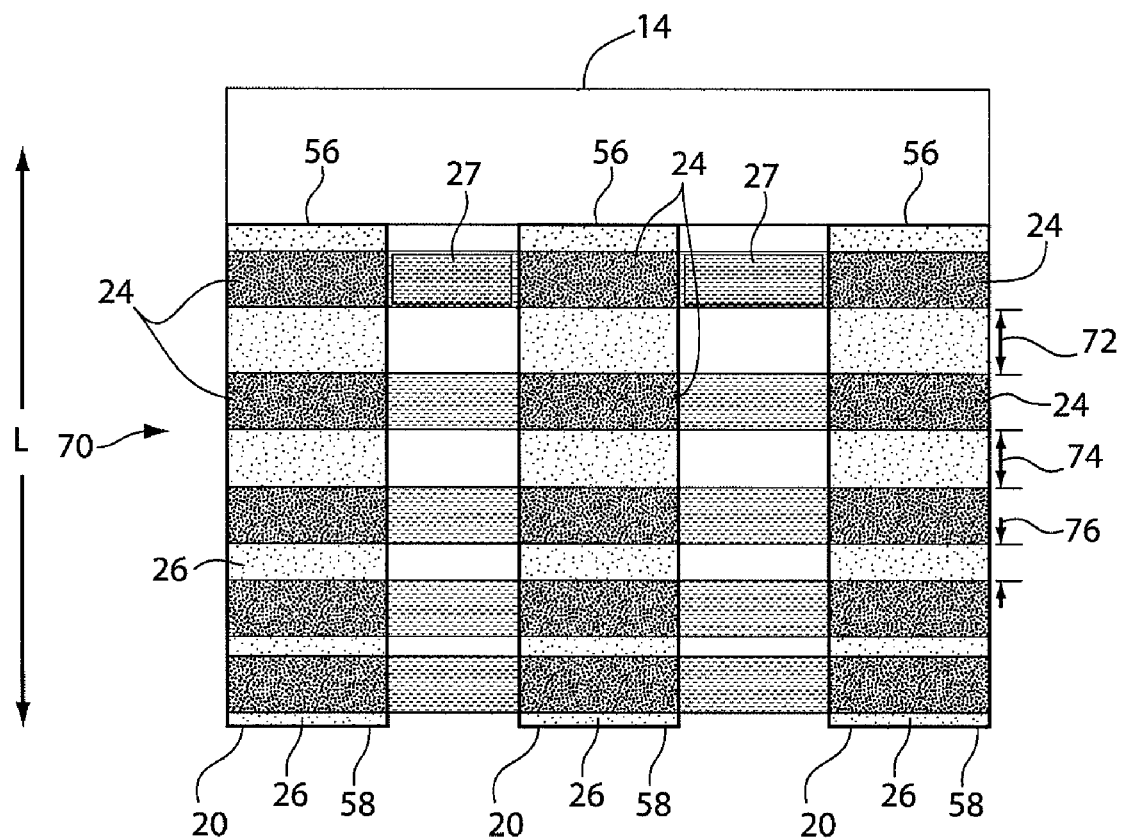
FIGS. 8A and 8B show a contact structure including discontinuous non-ohmic portions according to another embodiment of the invention.
Figure 8B:
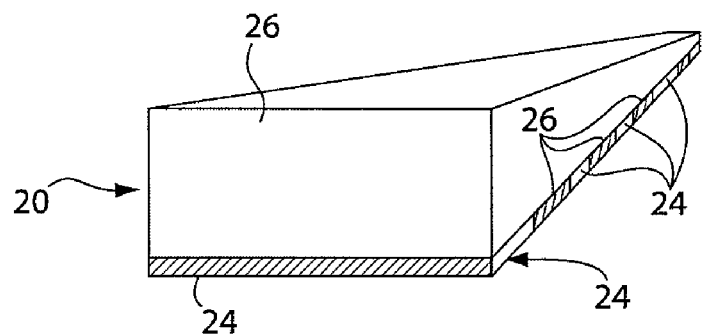
Figure 9:
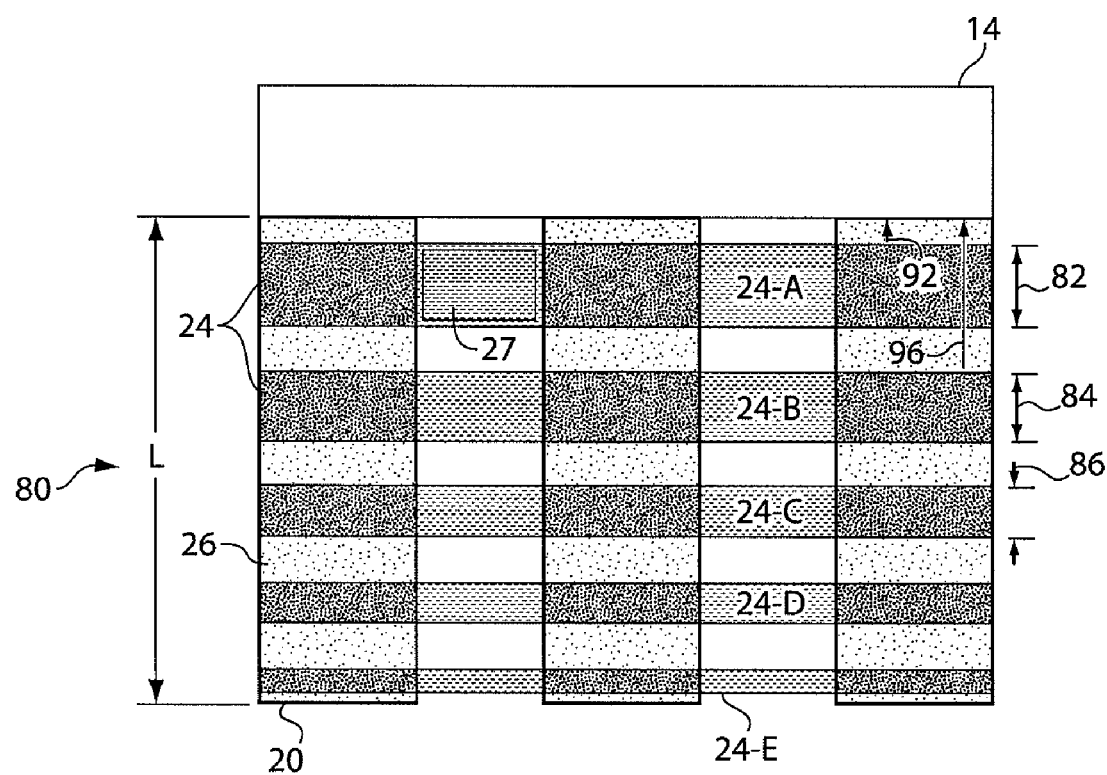
FIG. 9 shows a contact structure including discontinuous non-ohmic portions according to another embodiment of the invention.
Figure 10A:
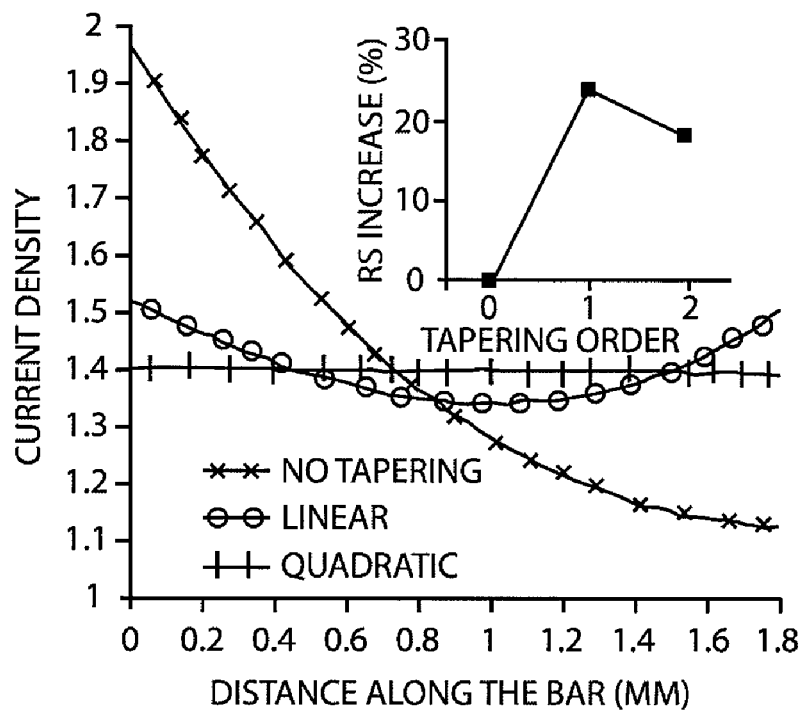
FIGS. 10A and 10B show results of simulations of contact structures according to another embodiment of the invention.
Figure 10B:
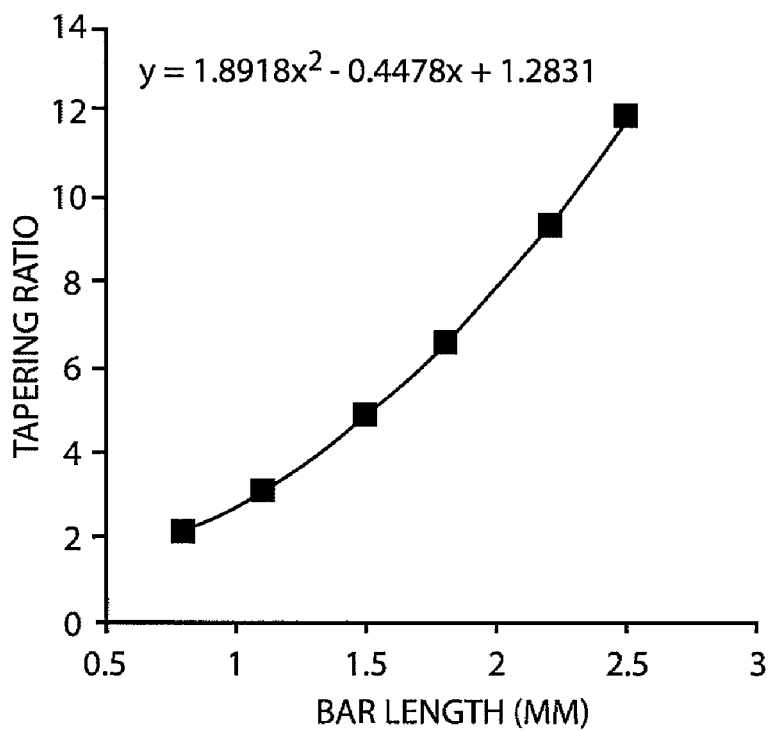

FIGS. 8 and 9 illustrate conductive portions that are disposed on more than one non-ohmic portions, which are discontinuous along a length of a contact member. FIG. 8A shows a top view of contact structure 70, including contact members 20 extending from conductive pad 14. Contact members 20 include conductive portion 26 and non-ohmic portions 24, which are discontinuous along the length L. FIG. 8B shows a side view of contact member 20. As shown in FIG. 8A, the respective spacings of successive non-ohmic portions may decrease along the length of the conductive portion. For instance, spacing 72 is greater than spacing 74, and spacing 74 is greater than spacing 76. In some embodiments, this arrangement can create a non-linear variation of contact resistance along the length of the contact member. Accordingly, current flowing from the conductive pad may be distributed substantially uniformly to the top surface of the device along the lengths of the contact members.

The widths of the non-ohmic portions of a contact structure may be the same, e.g., as shown in FIG. 8A; however, in some cases, the widths may differ. For instance, the widths of successive non-ohmic portions may decrease along the length of the conductive portion.

FIG. 9 shows another arrangement of conductive portions disposed on more than one non-ohmic portions. FIG. 9 shows a top view of contact structure 80, including contact members 20 extending from conductive pad 14. Contact members 20 include conductive portion 26 and non-ohmic portions 24, which are discontinuous along the length L. As shown in FIG. 9, the respective widths of successive non-ohmic portions may decrease along the length of the conductive portion. For instance, width 82 of non-ohmic portion 24-A is greater than width 84 of non-ohmic portion 24-B, and width 84 is greater than width 86 of non-ohmic portion 24-C. As illustrated in this figure, non-ohmic portion 24-A is positioned closer to the conductive pad than non-ohmic portion 24-B, since distance 92 of non-ohmic portion 24-A is less than distance 96 of non-ohmic portion 24-B. In some embodiments, this arrangement can create a non-linear variation of contact resistance along the length of the contact member. Accordingly, in such structures, current flowing from the conductive pad may be distributed substantially uniformly to the top surface of the device along the lengths of the contact members.

The respective spacings between the non-ohmic portions of a contact structure may be the same, e.g., as shown in FIG. 9; however, in some cases, the spacings may differ. In one embodiment; a contact structure may combine the arrangements of non-ohmic portions shown in FIGS. 8A and 9. For instance, respective widths and spacings of successive non-ohmic portions may decrease along the length of the conductive portion. In another embodiment, respective widths of successive non-ohmic portions may decrease along the length of the conductive portion, while respective spacings between the successive non-ohmic portions may increase along the length of the conductive portions. In yet another embodiment, a contact structure may include the opposite arrangement. In some cases, any such arrangement may be suitable for contact structures of the invention, e.g., such that the contact resistance of the contact member varies non-linearly along the length of the contact member.

As illustrated in the embodiments of FIGS. 8 and 9, non-ohmic portions are substantially parallel to one another and positioned substantially perpendicular to the conductive portions. Similarly in FIGS. 8 and 9, conductive portions are substantially parallel to one another. In other embodiments, however, non-ohmic portions can be positioned at different angles relative to one another and/or relative to the conductive portions, and the same may apply to the conductive portions. For instance, some of the non-ohmic portions of a contact structure may be parallel to one another, and other non-ohmic portions of the contact structure may be positioned at one or more angles, e.g., 30°, 45°, 60°, or 75°, relative to one another. As such, some or all of the non-ohmic portions may be positioned at different angles relative to the conductive portions.

Also illustrated in the embodiments of FIGS. 8 and 9 are non-ohmic portions 24 that extend across the width of the contact structure. In other embodiments, contact structures may include a non-ohmic layer that does not include portions 27. For instance, the non-ohmic portions may be discontinuous across successive conductive portions. In yet other embodiments, some, or all, of non-ohmic portions may be connected (e.g., non-ohmic portions 24-A, 24-B, 24-C, 24-D, and 24-E may be connected to one another).

Contact members, including conductive portions and non-ohmic portions, may have any suitable dimension. For instance, the length of a conductive pad can range from 10 μm to 500 μm (e.g., between 10 μm and 200 μm, between 200 μm and 350 μm, or between 350 μm and 500 μm). The width of a conductive pad can range, for example, from 0.1 μm to 50 μm (e.g., between 0.1 and 10 μm, between 1 μm and 20 μm, between 20 μm and 30 μm, or between 30 μm and 50 μm); The height of the conductive and/or non-ohmic portions can vary based on, for example, current and power to be supplied to the LED, or based on deposition and processing parameters. For example, conductive and/or non-ohmic portions can have a height ranging from 0.1 μm to 100 μm (e.g., between 0.1 μm and 1 μm, between 1 μm and 10 μm, or between 10 μm and 100 μm).

Conductive portions can be made of any suitable material. In some embodiments, a metal is used to form a conductive portion. Non-limiting examples of metals include gold, silver, platinum, copper, aluminum, nickel, titanium, tungsten, combinations thereof. Other metals or metal alloys, including transition elements from Groups 3-12 of the Periodic Table of Elements, can also be used. In other embodiments, a conductive portion may include a semi-conductive material. Sometimes, a conductive portion can be formed of the same material as a conductive pad.

In some embodiments, the composition of materials used to form the conductive portions can cause the contact resistance to vary non-linearly as a function of length of the contact member. For example, a conductive portion may be formed of a conductive material and may include a dopant having a lower conductivity (i.e., higher resistivity) than that of the conductive material. The dopant may be integrated into the conductive material so as to form a non-linear concentration gradient of the dopant along a length of the contact member. In some cases, such a composition can cause the contact resistance to vary non-linearly in the contact member.

Impurities may include any suitable material including metals, semi-conductors, and insulators. A suitable dopant may depend on, e.g., the composition of the conductive portion, the compatibility of the dopant with the material used to form the conductive portion, and/or deposition and processing parameters.

Non-ohmic portions can be formed of any suitable material. The non-ohmic portion may have a lower conductivity (i.e., higher resistivity) than that of the conductive portion. In some cases, non-ohmic portions may include insulators such as oxides and nitrides (e.g., silicon oxide and silicon nitride). In other cases, non-ohmic portions may include Schottky metals (i.e., Schottky contact materials). Suitable Schottky metals may depend on the material used to form the conductive layer and/or the particular material used to form the top surface of the device (e.g., the n-doped layer). For example, a top surface formed of GaN may include contact members with non-ohmic portions comprising indium-tin oxide (ITO). In another example, a layered stack of metals could be used to form a Schottky contact containing combinations of Ti, Pt, Au, Cu, and/or Pd.

The material composition of the non-ohmic layer may influence the design (e.g., shape) of the contact member. For example, a contact member having a non-linear variation in contact resistance (e.g. a function of the length of the contact member) may include a non-ohmic portion formed of an insulating material, and the non-ohmic portion may have a shape defined by a quadratic. In another example, a contact member having a non-linear variation in contact resistance can include a non-ohmic portion formed of a Schottky metal, and the non-ohmic portion may have a rectangular shape.

In some cases, it may be desirable for particular arrangements of the non-ohmic and/or conductive portions to have contact structures made in certain materials. For instance, certain arrangements of conductive and non-ohmic portions may allow increased current distribution across the top surface of the device, while also increasing light output from the top surface. For example, in some embodiments involving the use of an opaque Schottky metal as the non-ohmic portion of a contact member, the number of conductive portions may be the same as the number of non-ohmic portions. E.g., each conductive portion may be in contact (e.g., aligned) with a non-ohmic portion. This arrangement may minimize the amount of the top surface covered by the opaque non-ohmic layer. In embodiments involving the use of a transparent Schottky metal (e.g., ITO) as the non-ohmic portion, the number of non-ohmic portions may be greater than the number conductive portions. E.g., the contact structure may have an arrangement similar to the embodiment shown in FIG. 7. In this embodiment, the non-ohmic portions may not hinder the light output from the surface of the LED, and, therefore, the non-ohmic portions lying outside of the contact members may not be a concern.

In some cases, a non-linear variation in contact resistance of a contact structure may be caused by a combination of factors such as the shape and material composition of the conductive portion and/or non-ohmic portion, or the shapes of both the conductive and non-ohmic portions. As such, light-emitting devices may include one or more combinations of embodiments described herein.

The following examples are intended to illustrate certain embodiments of the present invention, but are not to be construed as limiting and do not exemplify the full scope of the invention.

EXAMPLE 1

This example shows that shapes of conductive and/or non-ohmic portions of a contact structure can be designed with particular dimensions to control the contact resistance along a length of a contact member. The control in the current resistance can allow efficient spreading of current density from one end to another end of the contact member, e.g., towards a central region of the device.

The design of a shape of a conductive and/or non-ohmic portion of a contact member may be controlled by taking into account the dimensions of the contact structure. An example of this approach is as follows:

Referring to FIGS. 3 and 5, each conductive portion of a contact member carries the current to be distributed along a spread equal to the period D. If a uniform current density $j_0$ is targeted, then the total current carried by a conductive portion is equal to $$I = j_0 DL$$

The current density inside the conductive portion at a distance x from the conductive pad is $$j_c(x) = \frac{j_0 D(L-x)}{wt}$$

The voltage drop acquired in the conductive portion at a distance x from the conductive pad is $$v_b(x) = \frac{j_0 D \rho}{2wt}[L^2 - (L-x)^2]$$

If the contact member includes a non-ohmic portion having a non-linear shape, e.g., as shown in FIG. 5A, the contact resistance $\rho_c(x)$ can change as a function of distance from the conductive pad (e.g., along a length of the contact structure). The total voltage drop at every point is the sum of two terms, one from the contact member and one through the ohmic contact portion.

$$v(x) = v_b(x) + v_c(x) = \frac{j_0 D \rho}{2wt}[L^2 - (L-x)^2] + \frac{j_0 D \rho_c(x)}{w}$$

If the goal is to have a uniform current drop from the contact member, to achieve this v(x) needs to be a constant. To achieve a unique solution, a constraint can be added such that the non-ohmic portion is zero at the end of the contact member at x=L. Assuming the contact resistance at x=L to be $\rho_c^0$ puts a value for the constant voltage drop $$\begin{aligned} v &= \frac{j_0 D \rho}{2wt}[L^2 - (L-x)^2] + \frac{j_0 D \rho_c(x)}{w} \\ &= \frac{j_0 D \rho}{2wt} L^2 + \frac{j_0 D \rho_c^0}{w} - (L-x)^2 \rho + 2t\rho_c(x) \\ &= 2t\rho_c^0 \end{aligned}$$

$$\rho_c(x) = \rho_c^0 \left[1 + \frac{\rho L^2}{2t\rho_c^0}(1 - x/L)^2\right] = \rho_c^0[1 + \sigma(1 - x/L)^2]$$

Next, an approximation can be used. One can assume that the spreading length in the contact member $L_T = \sqrt{\rho_c/R_{sheet}}$ is larger than the width of contact member. If this is the case, one can assume that covering-up a portion of the conductive portion will result in a proportional increase in the effective contact resistance. In particular, if the conductive portion is partially covered leaving w' contact area (where w'=b and w=a in FIG. 5A), the effective contact resistance is $$\rho_c = \rho_c^0 \frac{w}{w'}.$$

That gives a relationship for the width of the non-ohmic portion $$\rho_c(x) = \rho_c^0 \frac{w}{w - w_{ox}(x)} \Rightarrow w_{ox}(x) = w\left[1 - \frac{1}{1 + \sigma(1 - x/L)^2}\right]$$

where $$\sigma = \frac{\rho L^2}{2t\rho_c^0}.$$

In the designs of the shapes of the non-ohmic portions, the tapering ratio $$\frac{a}{b} \equiv \frac{w}{w'} = \sigma + 1,$$

can be used, wherein the tapering ratio can be related to the length of the contact member by the above function in order to achieve uniform current distribution along the length of the contact member.

This example shows that a contact member can be controlled, e.g., to have efficient current spreading along a length of the contact member, by designing the non-ohmic portion to have a particular non-linear shape using the above function, which relates the tapering ratio of the non-ohmic to the length of the contact member. Accordingly, other non-linear shapes of non-ohmic and/or conductive portions can be designed using a similar procedure according to other embodiments of the invention.

EXAMPLE 2

This example shows that shapes of conductive and/or non-ohmic portions of a contact structure can be designed with particular dimensions to control the contact resistance along a length of a contact member.

FIG. 9A shows simulations for current distribution in contact members with non-ohmic portions having three different shapes: rectangular (e.g., no tapering; tapering order=0), triangular (e.g., linearly tapered; tapering order=1), and a shape defined by a quadratic equation (e.g., non-linearly tapered; tapering order=2). As illustrated in the graph, the contact member including the non-ohmic portion having a shape defined by a quadratic caused current to be distributed substantially uniformly, e.g., along the length of the contact member. The inset shows the series resistance in each case.

FIG. 9B shows the curvature (e.g., the tapering ratio, a/b) of a non-ohmic portion optimized as a function of contact member length. As shown in the graph, the tapering ratio varies non-linearly along the length of the contact member, e.g., from the first end to the second end of the contact member. Here, the tapering ratio as a function of contact member length can be defined by the quadratic equation shown in the figure.

This example shows that in certain embodiments, contact members including non-ohmic portions having non-linear shapes can spread current more uniformly across the length of the contact member compared to non-ohmic portions having linearly tapered or rectangular shapes.

EXAMPLE 3

This example shows that LEDs and components associated therewith can be designed with particular dimensions to control certain aspects of the device (e.g., current spreading).

The aspect ratio of an LED can influence the current dissipation of the system. For instance, the aspect ratio 'R' of an LED including contact members can be calculated according to the following equation as shown below:

$$R=\sqrt{Ad/c}$$

where A is the die's surface area (e.g., length multiplied by width) and c and d are the aspect ratios of the die. For example for an LED with a 16×9 aspect ratio, c=16 and d=9. As described above, in order to allow light generated in the LED to be emitted through the surface, contact members may not cover the entire surface of the LED. Since the contacts may cover only a portion of the surface of the LED, the contact resistance is divided by the surface coverage ratio f, as shown in the following equation $$\rho_{n-c} \rightarrow \rho_{n-c}/f$$

The current density across the junction can be estimated according to the following equation as shown below:

$$J=J_0(e^{eV_j/kT}-1),$$

where $J_0$ is the junction saturation current and T the absolute temperature. The above estimates neglect the contribution of the non-ohmic material in lateral current spreading. However, in general, the current spreading may be predominantly occurring in the conductive portion of the contact member because the conductivity of the conductive portion may be much greater than the conductivity of the non-ohmic portion. For example, the ratio of the conductivities of the conductive portion to non-ohmic portion can be in the range of from about 100 to about 500.

In a similar system (but with infinite separation between the conductive pads), if the calculation is performed in a forward bias (e.g., $V_j$>>kT/e) and if the voltage drop across the series resistance is much larger than kT/e (e.g., $(\rho_{p-c}+\rho_{n-c}/f+\rho_p t_p+\rho_n t_n)J_0 e^{eV_j/kT}$>>kT/e), then a linear approximation of the current density distribution at the junction can be estimated according to the following equation $$J(x)=J_1(e^{-x/L_s}+e^{-(L-x)/L_s})$$

where $J_1$ is the current density beneath a conductive pad, x is the distance from a conductive pad, and $L_s$ is the current spreading length as shown in the following equation $$L_s=\sqrt{(\rho_{p-c}+\rho_{n-c}/f+\rho_p t_p+\rho_n t_n)t_m/\rho_m}$$

This estimation assumes an infinite separation between the conductive pads. However, for a linear approximation with non-infinite separation, the solutions for individual conductive pads can be added together. The procedure described above introduces an error close to the die center, but is not believed to significantly alter the physical trends.

The minimum current density can appear at the center of the device x=L/2, where L is the length of the device, and can be estimated according to the following the following equation $$J_{min}=2J_1 e^{-L/2L_s}$$

where the uniformity factor is estimated as shown in equation $$U = \frac{J(L/2)}{J(0)} = \frac{2e^{-L/2L_s}}{1+e^{-L/L_s}}.$$

For a die with the same surface area, switching from a square shape to a rectangular shape with aspect ratios c,d where the contact members are along the small side, the minimum current density increases and the uniformity factor can be modified as shown in the following equations $$J'_{min} = 2J_1 e^{-\frac{\sqrt{Ad/c}}{2L_s}}$$

$$U' = \frac{J(L'/2)}{J(0)} = \frac{2e^{-\sqrt{Ad/c}/2L_s}}{1+e^{-\sqrt{Ad/c}/L_s}}$$

Thus, a uniformity increase factor can be estimated as shown in equation $$S = U'/U = \frac{1+e^{-\sqrt{A}/L_s}}{1+e^{-\sqrt{Ad/c}/L_s}} e^{\frac{\sqrt{A}}{2L_s}(1-\sqrt{d/c})}$$

For example, the uniformity increase factor 'S' has a minimum value S=1 for the square case (e.g., c=d). For a 16×9 rectangle, assuming the following values: $\rho_m$=2.2·10$^{-6}$ Ωcm (gold), $\rho_{p-c}$=1.0·10$^{-3}$ Ωcm$^2$, $\rho_p$=5.0 Ωcm, $\rho_{n-c}$=1.0·10$^{-4}$ Ωcm$^2$, $\rho_n$=5.0×10$^{-3}$ Ωcm, n-contact surface coverage 10%, and thicknesses for p-, n-, and metal 0.3 μm, 3.0 μm and 2 μm (at a 10% coverage). Then $L_s$ equals 1.4 mm. If the die has a surface area of A=25 mm$^2$. In the square case U=0.325, while in the 16×9 case U'=0.5, or a uniformity increase factor S=1.54, i.e. a 54% increase of current uniformity.

Thus, without wishing to be bound by theory, it is believed that using a rectangular shape for an LED can provide benefits in the current spreading. The contact resistivity can alternatively or additionally be altered to enhance the current spreading by including a non-ohmic portion underneath a portion of the conductive portion.

As shown in FIG. 4, non-ohmic portion 24 is included under a portion of conductive portion 26. The non-ohmic portion has a greater width at the top of the bar (e.g., close to conductive pads 14 and 16) and becomes narrower towards the central area of the die.

Contact resistivity is generally proportional to the contact area. For example, the contact resistivity increases as the contact area decreases as shown in the following equation $$\rho_{n-c}^{eff} = \frac{\rho_{n-c}}{f_{eff}} = \frac{\rho_{n-c} W}{2w} = \frac{\rho_{n-c} WL}{2xw_b} = \frac{\rho_{n-c}}{f} \frac{L}{2x}$$

where W is the repetition rate of the contact members (e.g., the number of contact members per unit area). Referring to FIG. 4, due to underlying non-ohmic portion, the area of the conductive portion is smaller at the edge of the conductive portion closest to the conductive pads and increases as the distance from the conductive pads increases. Due to the difference in contact area, the contact resistivity is higher close to the conductive pads and decreases gradually towards the center of the LED. The difference in contact resistivity can force the current to travel further along the contact member towards the center of the die, thereby reducing current crowding, increasing uniformity of light emission through the surface, and increasing performance. The current spreading length can be estimated according to the following equation $$L_s(x)=\sqrt{(\rho_{p-c}+(\rho_{n-c}/f)(L/2x)+\rho_p t_p+\rho_n t_n)t_m/\rho_m}.$$

The junction current density along the die can be estimated by the following equation $$J(x) = J_1 e^{-\int_0^x dx/L_s(x)} + J_1 e^{-\int_L^x dx/L_s(L-x)} \text{ and}$$

the minimum current is at the center of the device (e.g., at x=L/2) can be estimated according to the following equation $$J_{min} = 2J_1 e^{-\int_0^{L/2} dx/L_s(x)}$$

The current uniformity factor for the structure shown in FIG. 4 can be estimated according to the following equation $$U = \frac{J(L/2)}{J(0)} = \frac{2e^{-\int_0^{L/2} dx/2L_s(x)}}{1 + e^{-\int_0^L dx/2L_s(x)}}.$$

In some cases, electrical transport of a contact member can be estimated. It may be assumed that a contact structure including contact members of length L distributes a uniform current density $J_0$ within a contact member period D. The total current to be carried by a contact member can be estimated as shown in the following equation $$I_{max} = J_0 DL.$$

This maximum current can flow at the top of the contact (e.g., at the conductive pad) corresponding to a current density that can be estimated as shown in the following equation $$J_{max} = \frac{J_0 D}{WT} L$$

At any distance x from the end of the contact member in contact with the conductive pad, the current density can be estimated as shown in the following equation $$J = \frac{J_0 D}{WT} x$$

The voltage drop per unit length can be estimated as shown in the following equation $$\frac{dV_c}{dx} = \frac{J_0 DRx}{WT}$$

and the heat generated per unit length can be estimated as shown in the following equation $$\frac{dQ_c}{dx} = \frac{2J_0^2 D^2 Rx^2}{WT}$$

Integrating the above equation the total voltage drop can be estimated as shown in the following equation $$V_c = \frac{J_0 DRL^2}{2WT}$$

and the total heat generated in the bar can be estimated as shown in the following equation $$Q_c = \frac{2J_0^2 D^2 RL^3}{3WT}.$$

This example shows that dimensions and arrangements of components of an LED can be designed based upon knowledge of certain parameters of the LED, e.g., in order to achieve certain performance criteria. These parameters may be combined with simulations to control certain aspects of the device.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

What is claimed is:

1. An electronic device comprising:
   a material body designed for use in an electronic device, the material body having a surface; and
   a contact structure supported by at least a portion of the surface of the material body, wherein the contact structure comprises:
   a patterned non-ohmic layer comprising a plurality of non-ohmic portions; and
   a patterned conductive layer comprising at least one conductive portion disposed on more than one of the non-ohmic portions and having a first end and a second end, the at least one conductive portion extending from a first conductive pad at the first end,
   wherein the first and second ends define a length of the at least one conductive portion, and
   wherein the contact structure has a contact resistance that varies non-linearly along the length of the at least one conductive portion, wherein the shape of a non-ohmic portion and/or the at least one conductive portion is non-liner, and wherein at least a portion of the shape of the non-ohmic portion and/or the at least one conductive portion can be defined by a step function.

2. The electronic device of claim 1, wherein the second end of the at least one conductive portion is connected to a second conductive pad.

3. The electronic device of claim 1, wherein the contact resistance varies non-linearly as a result of the shape of the non-ohmic portion and/or the at least one conductive portion.

4. The electronic device of claim 1, wherein a non-ohmic portion comprises an insulator.

5. The electronic device of claim 1, wherein a non-ohmic portion comprises a Schottky metal.

6. The electronic device of claim 1, wherein a non-ohmic portion comprises a material having a higher contact resistance than that of the at least one conductive portion.

7. The electronic device as in claim 1, wherein the non-ohmic portions are discontinuous.

8. The electronic device as in claim 1, wherein the non-ohmic portions are substantially perpendicular to the at least one conductive portion.

9. The electronic device as in claim 1, wherein the non-ohmic portions are substantially parallel to one another.

10. The electronic device as in claim 1, wherein the respective widths of successive non-ohmic portions decrease along the length of the at least one conductive portion.

11. The electronic device as in claim 1, wherein the respective spacings between successive non-ohmic portions decrease along the length of the at least one conductive portion.

12. The electronic device as in claim 1, wherein the at least one conductive portion is further disposed on a portion that is conductive.

13. The electronic device as in claim 1, wherein the at least one conductive portion is disposed on at least two non-ohmic portions that are separated by a portion that is conductive such that areas of overlap between the at least one conductive portion and the at least two non-ohmic portions are separated by an area of overlap between the at least one conductive portion and the portion that is conductive.

14. The electronic device as in claim 1, comprising at least a second conductive portion extending from the first conductive pad and disposed on more than one non-ohmic portions.

15. The electronic device as in claim 1, wherein the electronic device is an LED.

16. The electronic device as in claim 1, wherein the patterned non-ohmic layer comprises a plurality of discrete non-ohmic portions.

17. An electronic device, comprising:
a material body designed for use in an electronic device, the material body having a surface;
a contact structure supported by the surface of the material body, the contact structure comprising:
a patterned non-ohmic layer comprising non-ohmic portions; and
a patterned conductive layer comprising conductive portions, at least one conductive portion disposed at least in part on a non-ohmic portion and having a first end and a second end, the first and second ends defining a length of the conductive portion, wherein at least one non-ohmic portion and/or conductive portion has a shape that varies non-linearly along the length of the conductive portion, and wherein the at least one non-ohmic portion and/or conductive portion has a shape defined by a quadratic function.

18. The electronic device as in claim 17, wherein the non-ohmic layer comprises an insulator.

19. The electronic device as in claim 17, wherein the non-ohmic layer comprises a Schottky metal.

20. An electronic device comprising,
a material body designed for use in an electronic device, the material body having a surface; and
a contact structure supported by at least a portion of the surface of the material body, wherein the contact structure comprises:
a patterned non-ohmic layer comprising a plurality of non-ohmic portions; and
a patterned conductive layer comprising at least one conductive portion disposed on more than one of the non-ohmic portions and having a first end and a second end, the at least one conductive portion extending from a first conductive pad at the first end,
wherein the first and second ends define a length of the at least one conductive portion, and
wherein the contact structure has a contact resistance that varies non-linearly along the length of the at least one conductive portion,
wherein the shape of a non-ohmic portion and/or the at least one conductive portion is non-and
wherein at least a portion of the shape of the non-ohmic portion and/or the at least one conductive portion can be defined by a quadratic.

21. An electronic device comprising,
a material body designed for use in an electronic device, the material body having a surface; and
a contact structure supported by at least a portion of the surface of the material body, wherein the contact structure comprises:
a patterned non-ohmic layer comprising a plurality of non-ohmic portions; and
a patterned conductive layer comprising at least one conductive portion disposed on more than one of the non-ohmic portions and having a first end and a second end, the at least one conductive portion extending from a first conductive pad at the first end,
wherein the first and second ends define a length of the at least one conductive portion, and
wherein the contact structure has a contact resistance that varies non-linearly along the length of the at least one conductive portion,
wherein a non-ohmic portion and/or the at least one conductive portion comprises a material composition that causes the contact resistance to vary non-linearly,
wherein the material composition of the non-ohmic portion and/or the at least one conductive portion changes along the length of the conductive portion.

22. An electronic device comprising,
a material body designed for use in an electronic device, the material body having a surface; and
a contact structure supported by at least a portion of the surface of the material body, wherein the contact structure comprises:
a patterned non-ohmic layer comprising a plurality of non-ohmic portions; and
a patterned conductive layer comprising at least one conductive portion disposed on more than one of the non-ohmic portions and having a first end and a second end, the at least one conductive portion extending from a first conductive pad at the first end,
wherein the first and second ends define a length of the at least one conductive portion, and wherein the contact structure has a contact resistance that varies non-linearly along the length of the at least one conductive portion, wherein a non-ohmic portion and/or the at least one conductive portion comprises a material composition that causes the contact resistance to vary non-linearly, wherein the material composition of the at least one conductive portion comprises an dopant.

* * * * *

UNITED STATES PATENT AND TRADEMARK OFFICE
CERTIFICATE OF CORRECTION

PATENT NO.         : 7,598,531 B2
APPLICATION NO.    : 11/357743
DATED              : October 6, 2009
INVENTOR(S)        : Alexei A. Erchak et al.

It is certified that error appears in the above-identified patent and that said Letters Patent is hereby corrected as shown below:

Column 21, Claim 1, line 2, the word "non-liner" should be "non-linear"

Column 22, Claim 20, line 24, the word "non-and" should be "non-linear, and"

Signed and Sealed this

Seventeenth Day of November, 2009

David J. Kappos
*Director of the United States Patent and Trademark Office*